(12) United States Patent
Bierschenk et al.

(10) Patent No.: US 6,473,718 B1
(45) Date of Patent: Oct. 29, 2002

(54) METHOD FOR DETERMINING BAG SIZE AND CASE PACK CONFIGURATIONS

(75) Inventors: Patrick Joseph Bierschenk, Dallas, TX (US); Boderick Gerard Hall, Highland Village, TX (US); Joseph Paul Sagel, Highland Village, TX (US)

(73) Assignee: Recct, Inc., Pleasanton, CA (US)

( * ) Notice: Subject to any disclaimer, the term of this patent is extended or adjusted under 35 U.S.C. 154(b) by 0 days.

(21) Appl. No.: 09/436,826

(22) Filed: Nov. 4, 1999

(51) Int. Cl.$^7$ ............................................. G06F 15/00
(52) U.S. Cl. ......................... 702/155; 53/64; 53/451; 53/504; 53/511
(58) Field of Search ................................ 702/127, 128, 702/129, 137, 152, 155, 156; 53/502, 503, 504

(56) References Cited

U.S. PATENT DOCUMENTS

| | | | | |
|---|---|---|---|---|
| 4,128,985 A | * | 12/1978 | Simmons | 53/64 |
| 4,718,217 A | * | 1/1988 | Ross | 53/504 |
| 5,473,866 A | * | 12/1995 | Maglectric et al. | 53/511 |
| 6,119,438 A | * | 9/2000 | Bacon et al. | 53/451 |

* cited by examiner

Primary Examiner—John S. Hilten
Assistant Examiner—John Le
(74) Attorney, Agent, or Firm—Colin P. Cahoon; Carstens, Yee & Cahoon

(57) ABSTRACT

A method for determining bag size to adequately accommodate a food product filled into a ba y a form and fill machine, and subsequently determining the appropriate case pack configuration. The method efficiently and accurately determines a bag size that is large enough to accommodate the product that falls into the bag without interfering with the sealing process of the bag and while determining the appropriate amount of fill within the bag. The method uses various empirically determined relationships from historical bag sizing trials for a specific product and applies these relationships to a series of models in order to solve for a bag length. The method eliminates the need for costly and time-consuming bag sizing trials.

48 Claims, 6 Drawing Sheets

METHOD FOR DETERMINING BAG SIZE AND CASE PACK CONFIGURATIONS

BACKGROUND OF THE INVENTION

1. Technical Field

The present invention relates to a method for determining bag sizes and case pack configurations for form and fill bags and, in particular, to determining bag sizings without the need for sizing trials by using empirical relationships developed from sizing trials for specific products, fixing a bag width, and then determining an appropriate bag length. The method also cross-checks the determined bag size for economical case pack configuration. The method allows for a quick determination of the appropriate bag size for food or like products (such as tortilla or potato chips) that is adequately large to allow for mechanical sealing of the bag without excess non-functional slack fill. By eliminating the need for sizing trials, bag sizing and case pack configurations can be determined quickly, accurately, and inexpensively.

2. Description of Related Art

It is standard practice in the retail food industry for snack foods and like products to be packaged in flexible bags which in turn are consolidated into case packs, typically cardboard boxes, for distribution to retail outlets. The bags are filled with product, such as potato chips, by use of a form and fill machine by methods well-known in the industry. In sizing a particular bag to accommodate a certain weight of product, the bag must be large enough to accommodate the product that falls into it without interfering with the mechanical sealing of the bag by the form and fill machine. Conversely, the bag should not be so large as to include unnecessary dead space or non-functional slack fill. This excessive slack fill not only gives the bag the appearance of not containing an adequate amount of product, but also might run afoul of certain relevant government regulations.

It is not unusual for a product manufacturer to offer the same product, such as a particular line or brand of potato chips, in multiple weight classes requiring different bag sizes for each class. For example, a specific line of potato chips might be offered in a 1-oz. small bag class intended primarily for vending machines, a 1 to 2-oz. single-serving bag class offered for sale primarily in a retail food setting, a 5-oz. bag for a larger class package offered primarily in retail food settings or convenience store settings, several large bag classes ranging from 8-oz. to 20-oz. offered for sale primarily in retail grocery outlets, and a wholesale restaurant class bag of 20 to 25 oz. In fact, it is not unusual for a retail chip manufacturer to break bag sizes down into seven or more classes and offer numerous individual product lines of varying weights within each class.

Product weight, and consequently appropriate bag size, frequently changes within each weight class for each individual product due to a number of factors. Reasons for varying the bag sizes over time are complex and involve a number of factors ranging from purely marketing or promotional considerations to pricing and economics. A weight change might be made to accommodate various regional expectations or in response to other market forces. Weight changes might be made to address consumer preferences or to implement a new pricing model. In order to remain competitive, a snack food manufacturer must be prepared to quickly address the needs of the marketplace and adjust bag sizes quickly and efficiently. It is not unusual for snack food companies to conduct hundreds of bag resizing trials for a variety of products during a single year. A historical database on the selected closed bag volume versus both product volume and product weight for many product lines can be accumulated as a result of such trials, but in the past such information has been of little use in determining a new, unique bag size for a given product.

Instead, each individual resizing project in the past has involved more art than science. Certain bag parameters, such as a permissible range of length-to-width ratios, are fixed. However, the ultimate bag size has usually been determined by conducting physical trials involving guess work and actual physical testing of proposed bag sizes until an acceptable size is determined.

Typically, a decision is made to change the weight of a specific product line within a specific sales class. Once the weight has been determined, several different bag sizes are experimented with to determine an ideal size that can both accommodate the product using standard form and fill machines and minimize slack fill. It may be necessary to adjust a starting bag size length and width numerous times until the appropriate bag size has been found. These experiments usually take place at a packaging plant and require a dedicated form and fill machine to physically make each proposed bag size until an acceptable bag size is found.

A further consideration may be the number of bags that can fit into a single shipping container or case pack. Once the bag size is determined, a suitable case pack configuration must be determined. An appropriate bag size might be determined during bag sizing trials that does not provide for an economical case pack arrangement. For example, after a bag size is determined from a sizing trial, it may be that further shortening of the bag would increase the number of bags accommodated by a single standard size case pack from 11 to 12. The economics of being able to add one additional bag to a case pack (which relates to "transportation efficiencies") might justify further bag sizing trials in order to develop a different size bag. Further, automatic case packing machines require certain bag orientations and packing efficiencies that require consideration.

In light of the above, it is not unusual for an individual bag sizing trial to take in excess of 40 man hours, a dedicated form and fill machine, and other indirect productivity losses before arriving at a suitable bag size and case pack configuration. Occasionally a bag size is determined by this hit and miss method of the prior art which is determined to be unacceptable once it goes into production, in which case the entire process starts anew with a resizing effort.

Accordingly, a need exists for a method of determining a bag size and related case pack configuration without the need for conducting sizing trials. This method should provide a quick and accurate determination of appropriate bag sizes and case pack configurations across a broad spectrum of bag classes. Ideally, the method should provide decision information to efficiently analyze the various cost and material factors involved. By eliminating the need for sizing trials, the method should greatly reduce the costs involved in changing bag sizes. Further, the method should insure the case pack compatibility with automation features and eliminate the need for resizing bags due to improved accuracy.

SUMMARY OF THE INVENTION

The present invention comprises a method for determining bag sizes and case pack configurations by first determining an appropriate bag length by performing a sequence of calculations relying on various empirically determined factors. The bag length calculated is then confirmed against a known empirical relationship and, if necessary, follow-up iteration of the calculations can be made to adjust previously assumed factors. Once the bag length is satisfactorily confirmed, bag sizing can then be compared to various case pack configurations by making another sequence of calculations. If necessary, the bag sizing can then be adjusted for case pack consideration.

The ability to quickly and accurately determine bag sizing eliminates timely and costly bag sizing trials as well as more accurately predicts the required bag size. Further, bag sizing can be easily adjusted in the event that case pack configurations or other considerations require modifications in the bag sizing. Since bag sizes and case pack configuration can be quickly determined and compared, the model is ideally suited for making fine-tuned adjustments to bag sizes and case pack configurations to optimize economic efficiencies. Complete sizing trials can be done in a very short time period, with a reduced chance for error, while also providing enhanced bag quality.

BRIEF DESCRIPTION OF THE DRAWINGS

The novel features believed characteristic of the invention are set forth in the appended claims. The invention itself, however, as well as preferred modes of use, further objectives, and advantages thereof, will be best understood by reference to the following detailed description of illustrative embodiments when read in conjunction with the accompanying drawings, wherein:

FIGS. 2b and 2c are cross-section area approximations of the bag of FIG. 2a;

DETAILED DESCRIPTION

The guiding principals for bag sizing and case pack configuration determination are to protect the product, optimize the shelf appearance of the package, and minimize the packaging costs. With regard specifically to bag sizing, a desirable target product fill percentage is between 85% and 90%. Experience has shown that a desirable bag length to bag width ratio should normally be between 1.6 to 1.9. In addition, the bag's ultimate shelf appearance and various governmental agency guidelines must be considered.

With regard to case pack configurations, as will be discussed in further detail below, bag size, orientation, and arrangement may ultimately dictate the number of bags that can be placed in any single case. Sales and weight restrictions might dictate specific case sizes. Automatic case packing machines characteristics and compatibility must also be considered.

By way of overview, the invention first determines a bag length and then determines a suitable case pack configuration. If necessary, the bag length can be changed due to case pack configuration considerations. Determining the bag length in general requires fixing a bag width and then using empirical data on other parameters and geometric modeling to solve for a bag length. The resultant calculation is confirmed against empirical data and recalculated if necessary.

A change in a bag size typically occurs when a decision is made to change the weight of a product offered in a given bag size class or to offer a product in a new weight. Consequently, the only fixed data point at the start of any bag sizing trial is the weight of the product per bag. Part of what must then be determined is the appropriate size or dimensions of a bag to accommodate this given product weight. A starting point for addressing this issue is to determine the bag volume required to accommodate the given product weight. The appropriate bag volume will accommodate a product volume plus additional fill space required by the packaging mechanics of a form and fill packaging machine and dictated by shelf appearance and product protection guidelines.

Figure 1A:
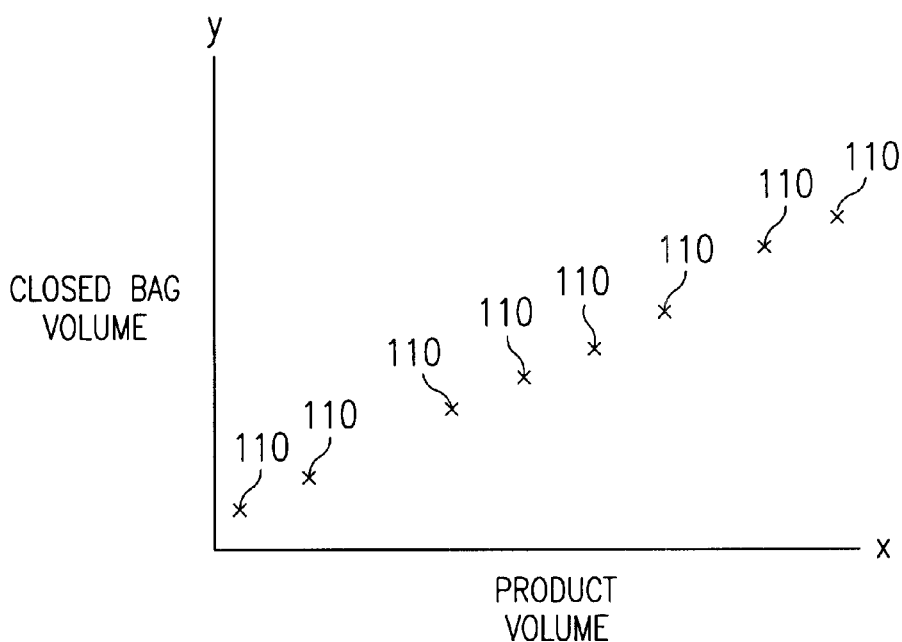
FIG. 1a is a representative plot of closed bag volume versus product volume.
Figure 1B:
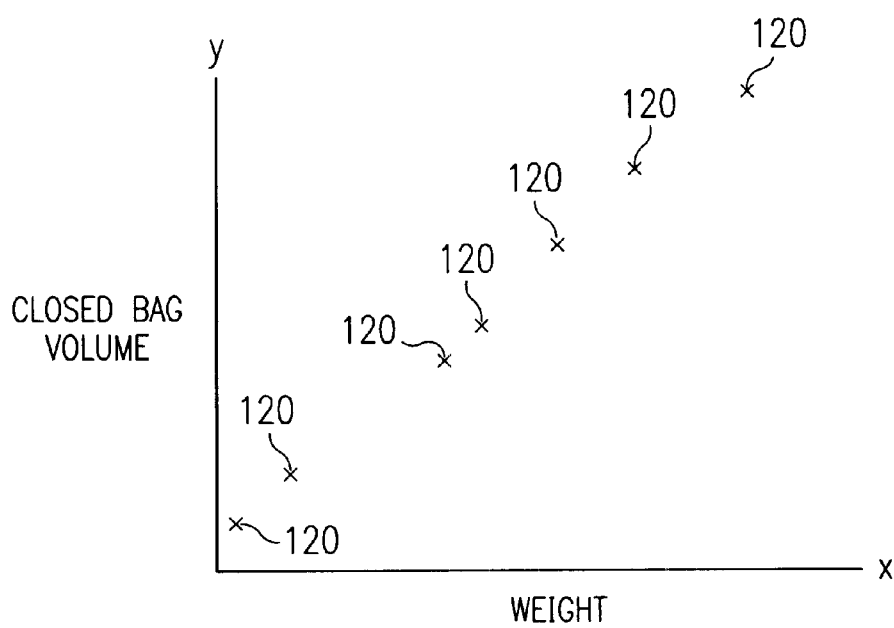
FIG. 1b is a representative plot of closed bag volume versus product weight.

The volume of a given product for a given weight of the product can be determined as the ratio of the weight of the product to the product's bulk density. Each individual product line, therefore, requires a different volume to accommodate a specific weight of product. The bulk density for certain products, however, is not always uniformly measured. For example, chips settle and break over time. Some chip products have unusual shapes that may result in differing bulk density measurements for different volume samples of the same product. Empirical data from sizing trials, however, reveals that the relationship between closed bag volume and product volume and the relationship between closed bag volume and weight are both linear in nature. This is illustrated by FIGS. 1a and 1b. The y-axis of FIG. 1a represents a closed bag volume. The x-axis of FIG. 1a represents the product volume, which is determined by dividing the product weight by the product bulk density. The points 110 plotted on FIG. 1a represent historical data from past sizing trials. Likewise, FIG. 1b shows the closed bag volume represented on the y-axis and the weight of the same single product represented on the x-axis. Again, the points 120 plotted on FIG. 1b are taken from historical bag size data. As FIGS. 1a and 1b illustrate, there is a linear relationship between either bag volume versus product volume or bag volume versus weight. As will be discussed below, the invention utilizes an empirically determined bag volume correlation in determining bag length. In this regard, the invention can rely on either bag volume versus product volume data or bag volume versus weight data for any given product, as both display linear progressions when charted. Since determination of product volume requires the additional step of dividing a product's weight by its bulk density, with the attending potential for additional error, a preferred embodiment of the invention uses empirical data on closed bag volume versus weight in establishing proper bag sizing.

Figure 2A:
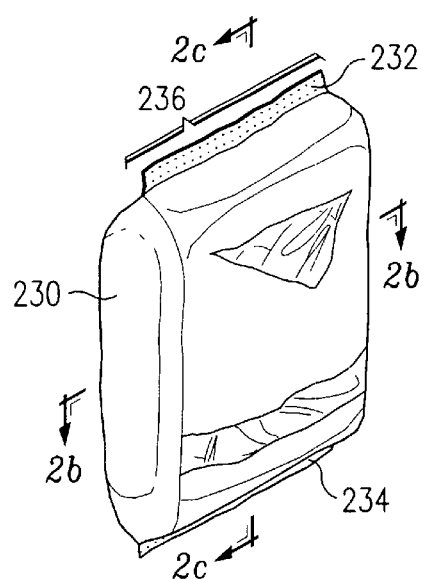
FIG. 2a is a perspective view of a bag of snack product.
Figure 2B:
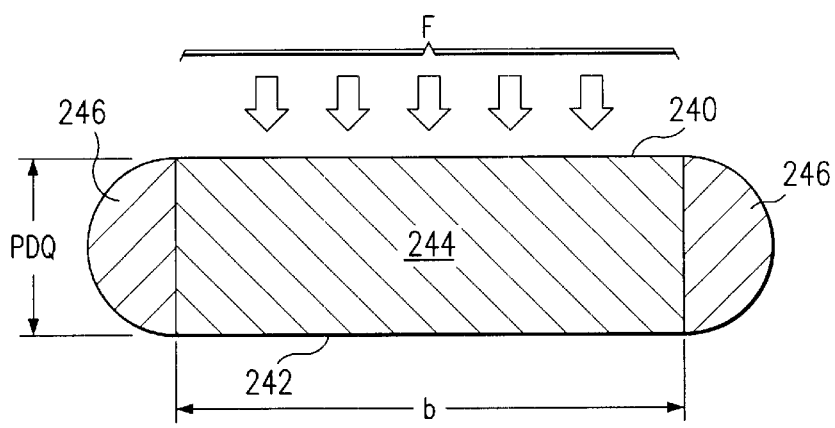
Figure 2C:
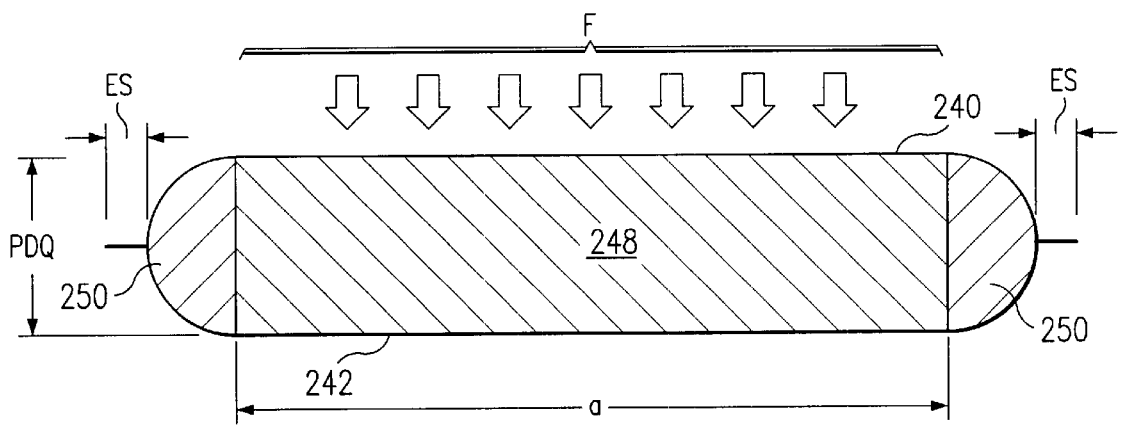

The invention uses a geometric model to approximate the length and width of a bag required to accommodate a given volume. This is illustrated in FIGS. 2a, 2b, and 2c. FIG. 2a is a perspective view of a filled and sealed bag 230 of product. FIG. 2b is a geometric approximation of a cross-section of the bag 230 along line A—A, while FIG. 2c is a geometric approximation of a cross-section of the bag 230 along line B—B. FIG. 2a also shows an upper end seal 232 and lower end seal 234, which are typically opposed surfaces of the interior of the bag that are heat and pressure sealed by a form and fill machine. The horizontal length 236 of the lower end seal 234 and upper end seal 232 are identical, since during the form and fill process the upper end seal of a filled bag is formed at the same time as, and is contiguous with, the lower end seal of an unfilled bag above. The form and fill machine then cuts this contiguous seal, thus forming the upper end seal 232 of the lower bag and lower end seal 234 of the upper bag. The length 236 of the end seals 232, 234 is referred to as a former size 236.

The vertical height of the bag 230 when laid on its side 242 and exposed to a certain vertical force along the exposed horizontal surface 240 of the bag 230 is referred to as the "Product Displacement Quantifier" (hereinafter "PDQ"). The PDQ is measured by placing the bag on one side 242 on a flat surface, as represented in both FIGS. 2a and 2b. A vertical force F is then evenly applied on the other side 240 of the bag 230 in order to make the dimensions of the bag 230 as uniform as possible. The force F should be adequate to "fill out" the bag 230 without rupturing any of the bag seals 232, 234 or the bag film. Typically, a force F of about 3 to 4 pounds is appropriate. The vertical distance from one side of the bag 242 to the other side of the bag 240 under such force F is measured as the PDQ.

FIG. 2b illustrates that when such vertical force F is applied the cross-section of the bag along line A—A approximates a rectangle 244 with two semi-circles 246 on either end. Consequently, the former size 236 can be calculated if the width of the rectangle "b" and the PDQ are known by using the following relationship:

Former=$b+\pi PDQ/2$

Likewise, in reference to FIG. 2c, the lengthwise cross-section of the bag 230 along line B-B illustrates that this cross-section view can also be approximated as a rectangle 248 with two semi-circles 250 on either end. However, the length of the bag must in addition take into account the width of each end seal 232, 234 (hereinafter "ES"). End seals 232, 234 in given size bag classes are usually standard widths ES, for example, ¼ or ½ inch end seals ES. In fact, there is a known relationship between end seal width ES and former size 236 for all bag sizes. Specifically, when a bag former size 236 is less than 6 inches, the end seal ES typically used is ¼ of an inch. When the bag former size is equal to or greater than 6 inches, the end seal width ES typically used is ½ of an inch. Consequently, an end seal width ES can easily be fixed for the purposes of determining bag length by assuming a former size 236 of either less than or greater than 6 inches. Therefore, the bag length can be approximated with reasonable accuracy by the following relationship:

Bag length=$a+\pi PDQ/2+2ES$.

In light of the above geometric models approximating the cross-sectional areas of the bag 230, bag volume can be closely approximated by use of the following formulas:

Bag Vol=$aPDQ(b+\pi TPDQ/4)+b\pi PDQ^2/4$

OR

Bag Vol=$PDQ$(bag length−$2ES−\pi PDQ/2$)(former−$\pi PDQ/2+PDQ/4$)+(former−$\pi PDQ/2$)($\pi PDQ^2/4$)

With the above formulas at hand, bag sizing is reduced to four variables: bag volume, bag length, former size, and PDQ.

Figure 3:
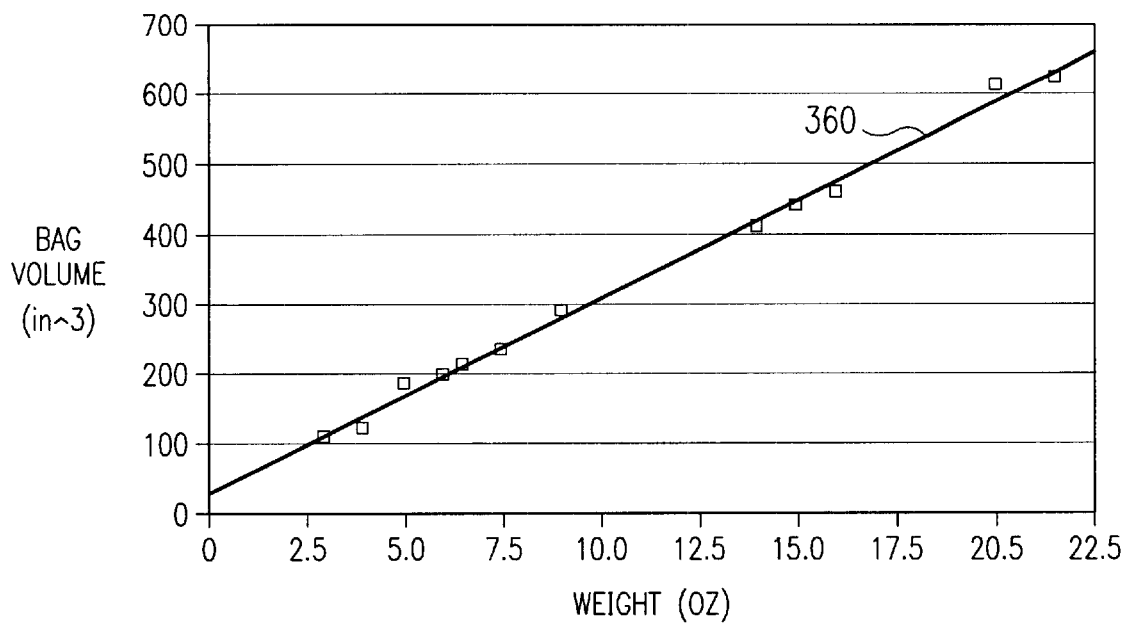
FIG. 3 is a plot of historical sizing data on Ruffles™ Potato Chips.

As previously discussed, empirical data on bag sizing trials has demonstrated that there is a linear relationship between bag volume and bag weight. Consequently, using such empirical data, a bag volume can be determined for any given desired product weight. For example, FIG. 3 shows a plot of historical sizing data on Ruffles™ Potato Chips. A best-fit line 360 has been plotted in order to determine a y-intercept and slope. This y-intercept and slope can then be used with the bag volume formulas listed above in order to reduce the variables involved in bag sizing to just bag length, former size, and PDQ. For example, in a preferred embodiment which solves for bag length, this reduces the calculations involved to the following:

$$\text{Bag Length} = \frac{y\text{-intercept} + \text{slope}(wt) - (\text{former} - \pi PDQ/2)(\pi PDQ^2/4)}{PDQ(\text{former} - \pi PDQ/2 + \pi PDQ/4)} + 2ES + \pi PDQ/2$$

A preferred embodiment of the invention fixes the former size and PDQ, thereby solving for bag length. Historical sizing trials again provide empirical information on the relationship between former width and PDQ. Specifically, empirical relationships have been established for big bag sizes, meaning a former size of six inches or greater, and small bag sizes, meaning a former size of less than six inches.

With regard to big bag sizes, it has been observed that a typical ideal ratio of bag length to former size is between 1.6 to 2. This desired ratio can be used to check the accuracy of a solved bag length in comparison to the former width and PDQ selected. Empirical data has also determined that an approximate PDQ can be determined when the ratio of the bag length to former sizing ratio is 1.6 or greater by taking a former size in inches, subtracting 0.5, and using the resultant number as a PDQ expressed in centimeters. For example, if a 7 inch former size is selected, this empirical relationship indicates that an appropriate PDQ is 6.5 centimeters. A bag length to former size ratio of less than 1.6 yields a slightly different relationship between PDQ and former size based on empirical data. In such case, the PDQ is determined by subtracting 1.0 from the former size expressed in inches and taking the resultant number as the PDQ in centimeters. For example, if the bag length to former size ratio is less than 1.6, and a former size is selected of 7 inches, empirical studies have indicated that an appropriate PDQ is 6 centimeters.

The empirical bag length, former size, and PDQ relationships can then be used, in an iterative fashion, to first solve for and then confirm a bag length. First, since a preferred bag length to former ratio is greater than 1.6, the method of subtracting 0.5 from a former size is used to determine a probable PDQ. Therefore, a former size is selected, usually based on an estimation of the required former width given the weight adjustment made within a particular bag sizing class. For example, a starting former size might be fixed at 8 inches. This would provide that the PDQ should be 7.5 centimeters. This PDQ is then converted into inches. Again, referring to the formula for determining bag length, it can now be seen that all of the variables have been provided for such solution for a given weight of product.

$$\text{Bag Length} = \frac{y\text{-intercept} + \text{slope}(wt) - (\text{former} - \pi PDQ/2)(\pi PDQ^2/4)}{PDQ(\text{former} - \pi PDQ/2 + \pi PDQ/4)} + 2ES + \pi PDQ/2$$

The y-intercept and slope are taken from empirical bag. sizing data on the product in question. The product weight has been provided as the starting data point. The former size has been fixed, which in turn determines the PDQ based on empirical relationships. Finally, the end seals are known dimensions, given the bag class considered. Therefore, a bag length expressed in inches can be calculated.

However, since the former size was arbitrarily selected, a confirming step is required whereby the ratio of bag length to the former size is calculated. If this ratio is greater than 1.6, then the appropriate PDQ was used for the given former.

If the bag length to former size ratio during the first confirming step is less than 1.6, then the appropriate PDQ empirical relationship was not used for the bag length calculation. In such instance, a new PDQ is calculated using the former size less 1.0 relationship. The newly determined PDQ is then used to again solve for bag length. Using the previous example of an 8 inch former, this would involve converting a PDQ of 7 centimeters to inches, and using the resultant PDQ in the above bag length formula, along with the 8 inch former size. A new bag length is then determined. Again, the bag length to former ratio is calculated to ensure that the proper PDQ empirical relationship, less than 1.6, was used. If not, the process repeats until the confirming step results in a match in the assumed PDQ to the empirical relationship from which it was derived.

Empirical relationships between formers and small bags (meaning less than six inch former size) yield a slightly different result. This is expressed in Table 1 below, which shows empirical relationships between bag length, former size, PDQ, and bag volume for end seals of ¼ inches.

TABLE 1

| Former Size | Bag Length | AIM PDQ | Max PDQ | Bag Volume |
|---|---|---|---|---|
| 4 | 4.75 | 1.65 | 1.9 | 9.09 |
| 4 | 5 | 1.75 | 2 | 10.04 |
| 4 | 5.25 | 1.9 | 2.15 | 11.16 |
| 4 | 5.5 | 2.1 | 2.35 | 12.46 |
| 4 | 5.75 | 2.2 | 2.45 | 13.50 |
| 4 | 6 | 2.35 | 2.6 | 14.71 |
| 5 | 5.5 | 2.8 | 3.05 | 18.70 |
| 5 | 5.75 | 2.85 | 3.1 | 20.05 |
| 5 | 6 | 3 | 3.25 | 21.69 |
| 5 | 6.25 | 3.15 | 3.4 | 23.36 |
| 5 | 6.5 | 3.22 | 3.47 | 24.87 |
| 5 | 6.75 | 3.33 | 3.58 | 26.50 |
| 5 | 7 | 3.44 | 3.69 | 28.16 |
| 5 | 7.25 | 3.52 | 3.77 | 29.77 |
| 5 | 7.5 | 3.6 | 3.85 | 31.41 |
| 5 | 7.75 | 3.68 | 3.93 | 33.06 |
| 5 | 8 | 3.75 | 4 | 34.72 |
| 5 | 8.25 | 3.83 | 4.08 | 36.42 |
| 5 | 8.5 | 3.9 | 4.15 | 38.11 |
| 5 | 8.75 | 3.97 | 4.22 | 39.82 |
| 5 | 9 | 4.04 | 4.29 | 41.55 |
| 5.25 | 6.25 | 3.25 | 3.5 | 25.20 |
| 5.25 | 6.5 | 3.35 | 3.6 | 26.90 |
| 5.25 | 6.75 | 3.45 | 3.7 | 28.64 |
| 5.25 | 7 | 3.55 | 3.8 | 30.41 |
| 5.25 | 7.25 | 3.65 | 3.9 | 32.20 |
| 5.25 | 7.5 | 3.72 | 3.97 | 33.95 |
| 5.25 | 7.75 | 3.79 | 4.04 | 35.71 |
| 5.25 | 8 | 3.87 | 4.12 | 37.53 |
| 5.25 | 8.25 | 3.95 | 4.2 | 39.37 |
| 5.25 | 8.5 | 4.03 | 4.28 | 41.24 |
| 5.25 | 8.75 | 4.1 | 4.35 | 43.09 |
| 5.25 | 9 | 4.15 | 4.4 | 44.91 |
| 5.5 | 7 | 3.66 | 3.91 | 32.71 |
| 5.5 | 7.25 | 3.75 | 4 | 34.61 |
| 5.5 | 7.5 | 3.83 | 4.08 | 36.52 |
| 5.5 | 7.75 | 3.92 | 4.17 | 38.48 |
| 5.5 | 8 | 4 | 4.25 | 40.25 |
| 5.5 | 8.25 | 4.08 | 4.33 | 42.43 |
| 5.5 | 8.5 | 4.16 | 4.41 | 44.44 |

TABLE 1-continued

| Former Size | Bag Length | AIM PDQ | Max PDQ | Bag Volume |
|---|---|---|---|---|
| 5.5 | 8.75 | 4.24 | 4.49 | 46.48 |
| 5.5 | 9 | 4.3 | 4.55 | 48.48 |
| 5.5 | 9.25 | 4.36 | 4.61 | 50.49 |
| 5.5 | 9.5 | 4.42 | 4.67 | 52.53 |
| 5.5 | 9.75 | 4.49 | 4.74 | 54.61 |
| 5.5 | 10 | 4.55 | 4.8 | 56.69 |
| 5.75 | 7.5 | 3.95 | 4.2 | 39.19 |
| 5.75 | 7.75 | 4.05 | 4.3 | 41.32 |
| 5.75 | 8 | 4.12 | 4.37 | 43.40 |
| 5.75 | 8.25 | 4.19 | 4.44 | 45.51 |
| 5.75 | 8.5 | 4.25 | 4.5 | 47.61 |
| 5.75 | 8.75 | 4.35 | 4.6 | 49.86 |
| 5.75 | 9 | 4.42 | 4.67 | 52.04 |
| 5.75 | 9.25 | 4.49 | 4.74 | 54.25 |
| 5.75 | 9.5 | 4.55 | 4.8 | 56.44 |

Using Table 1, a former size is selected, again usually based on an estimation of the appropriate former size required for the given weight and bag class. An "AIM" PDQ is then selected within the range of approximate PDQs for the selected former size. This PDQ and former size are then used in the bag length formula to solve for bag length. The determined bag length and selected former size are then checked against the empirical data of Table 1 to confirm that the appropriate PDQ was selected. The new PDQ indicated by the data of Table 1 is then used to repeat the bag length calculation. The resultant bag length and selected former size are then again checked against the data in Table 1 to determine a new PDQ. This process is repeated until a bag length is calculated that matches up to one of the Table 1 values.

Figure 4A:
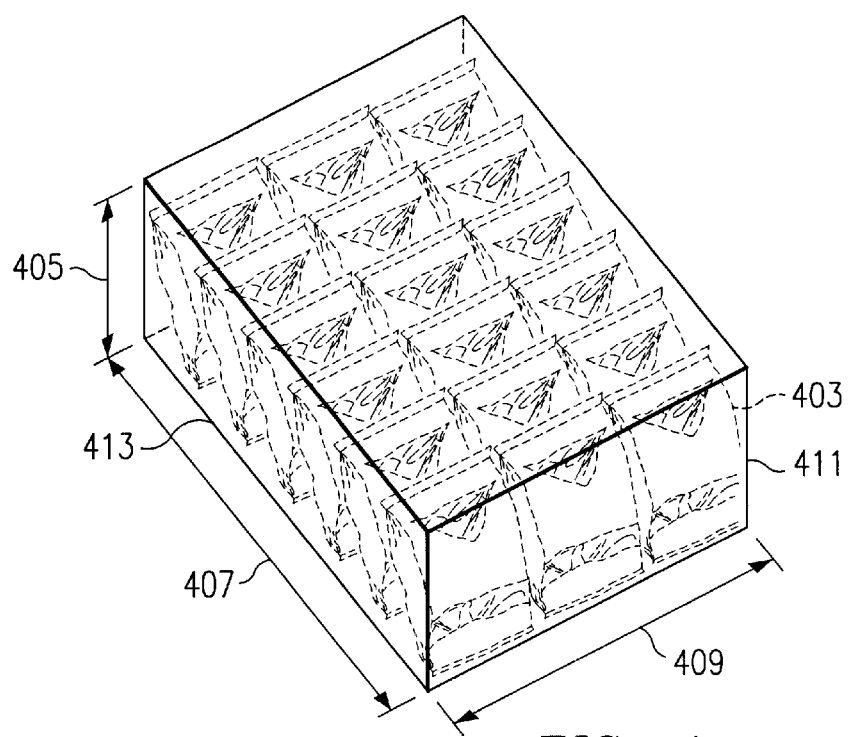
FIGS. 4a, 4b, and 4c illustrate a single layer standup case pack configuration.
Figure 4B:
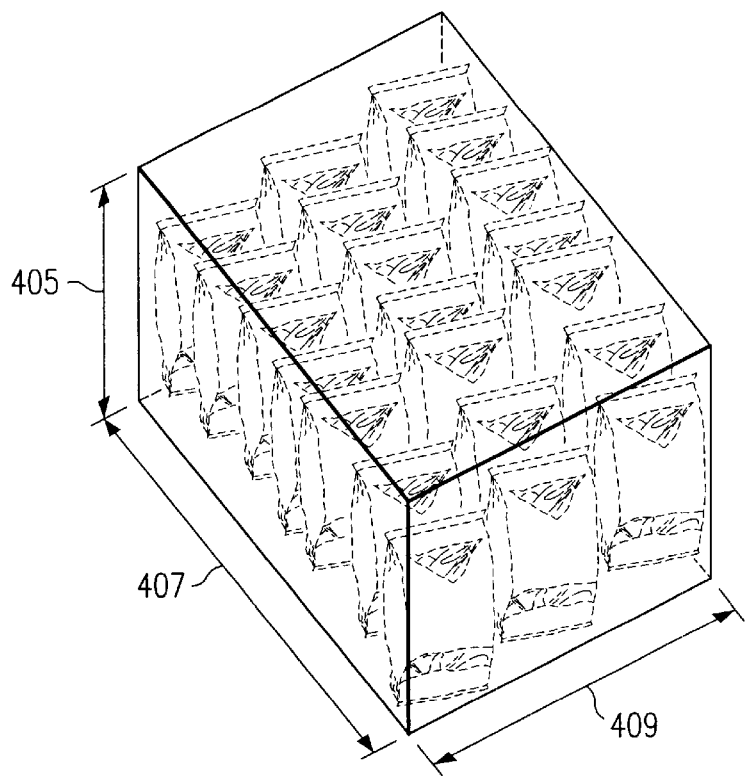
Figure 4C:
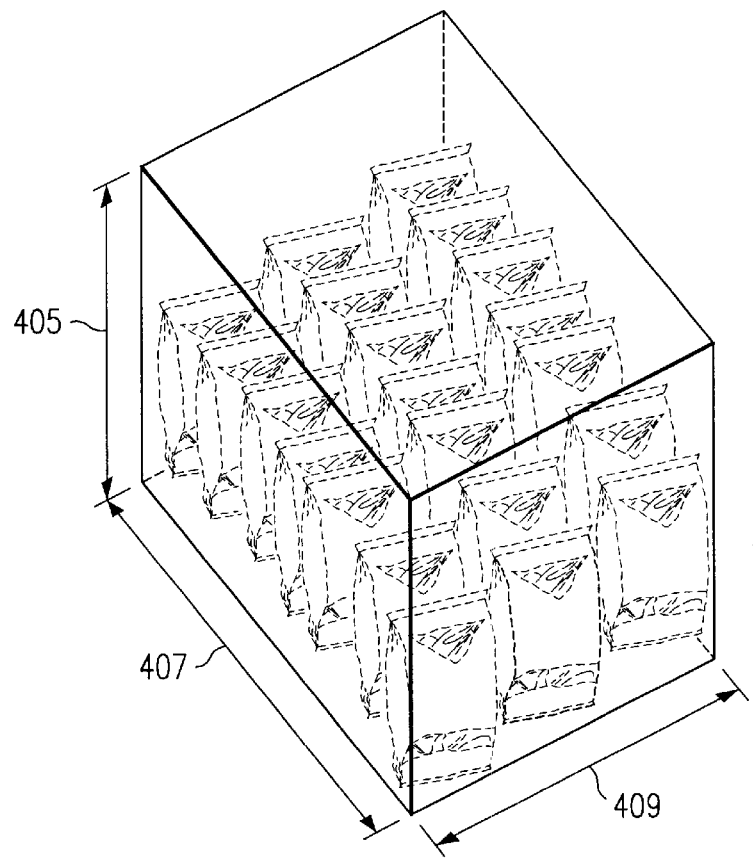
Figure 5A:
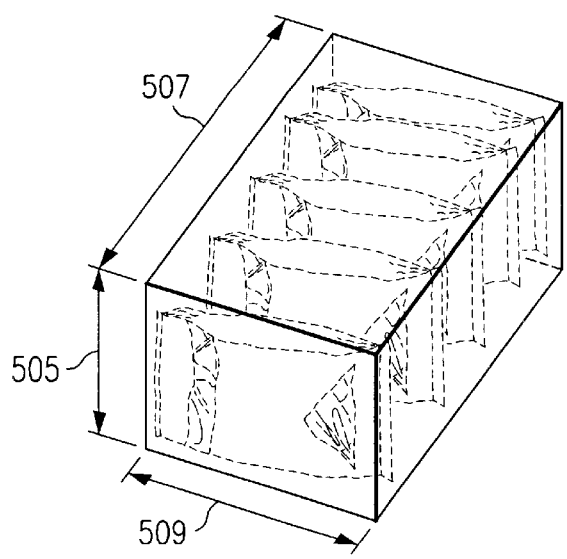
FIGS. 5a, 5b, and 5c illustrate the single-layer side pack case configuration.
Figure 5B:
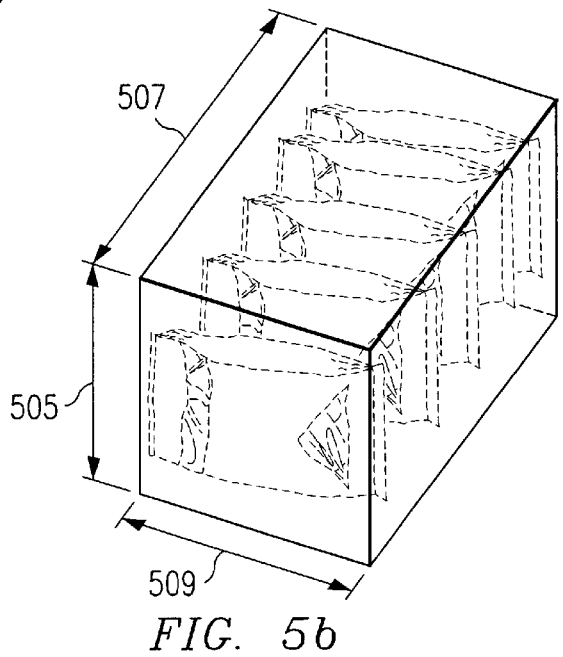
Figure 5C:
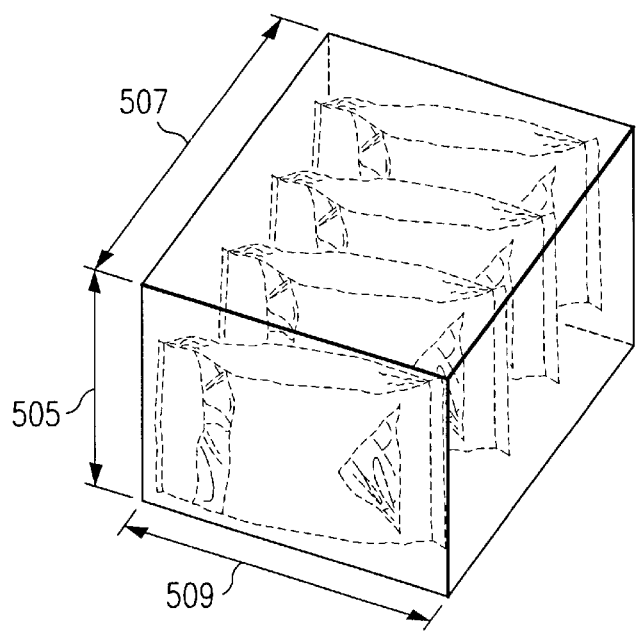
Figure 6:
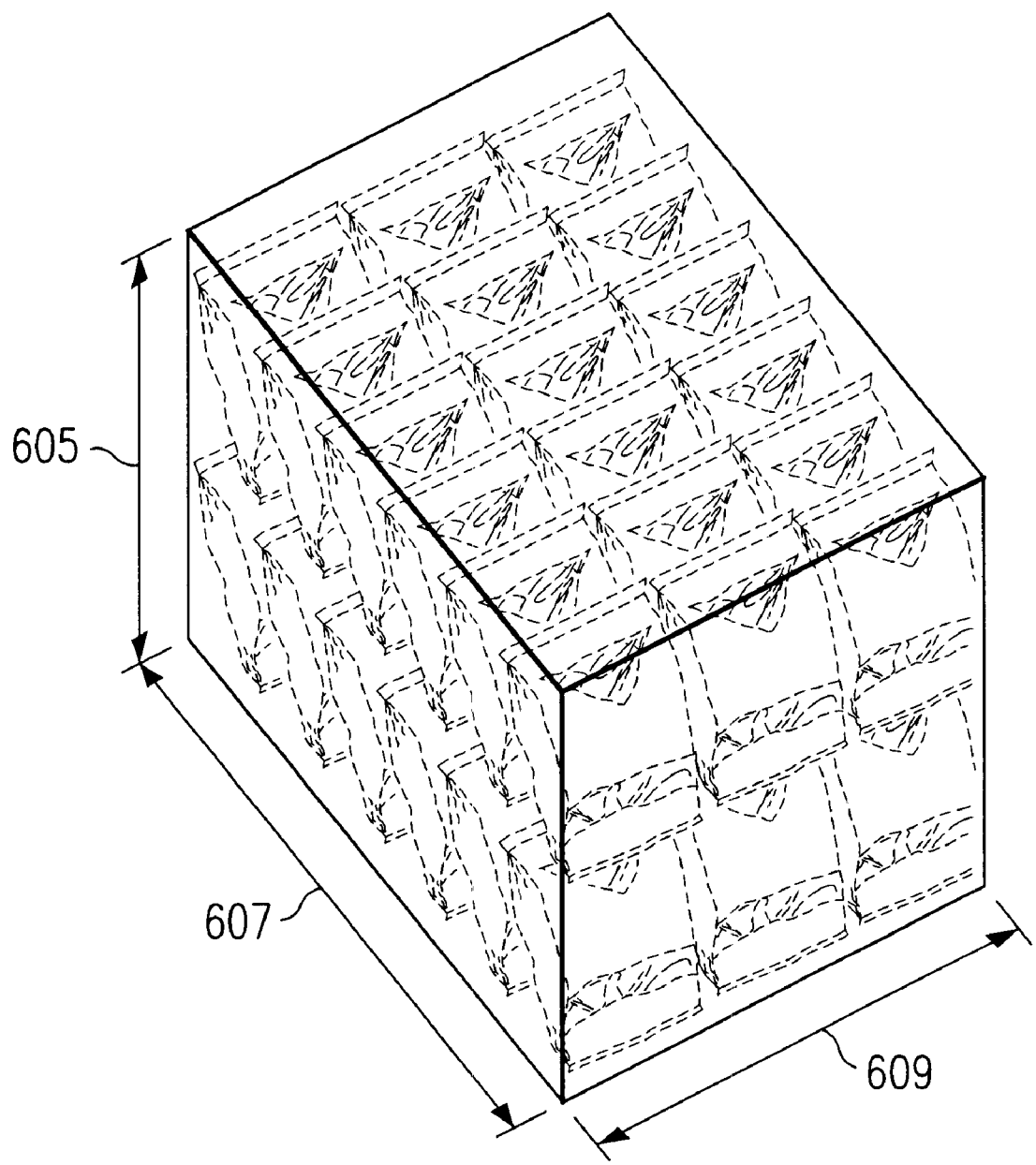
FIG. 6 illustrates a multi-layer standup/lay-down pack configuration.

Once the bag size has been determined, the optimal case pack configuration for the bag size is next determined. Case packs are typically packaged as single-layer stand-up packs, as shown in FIGS. 4a, 4b, and 4c, single-layer side packs, as shown in FIGS. 5a, 5b, and 5c, or multi-layer stand-up/lay-down packs, as shown in FIG. 6. The cases themselves are typically available in a number of standard sizes, such as 20½ inches by 15⅞ inches by 6 to 14 inches for the single-layer standup and side pack configuration, and 19¹¹⁄₁₆ inches by 15 ⅞ inches by 7 to 10 inches for the multi-layer standup pack configuration. Consequently, using the methods described below, a number of standard size cases and configurations can be compared to determine what case pack configuration for the bag length selected is appropriate.

The method used to determine the number of sized bags that will be accommodated in a case pack configuration depends not only on the type of case pack selected but the relationship between the dimensions of the sized bag with the standard case selected. Starting with the single-layer standup configuration illustrated in FIGS. 4a, 4b, and 4c, it can be seen that FIG. 4a illustrates an example of the case height 405 being less than the effective bag length 403. (Effective bag length is the vertical height of a bag when placed on end and, with reference to FIG. 2c, can be calculated as follows: effective bag length=a+PDQ.) In this instance, the number of bags 403 that can be accommodated in such case is determined by comparing the bag volume to the case volume and making a slight adjustment for the packing efficiency of this configuration. Specifically, it has been empirically determined that, in the single-layer standup configuration when the case height is less than the effective bag length, the required case volume can be determined by multiplying a given single bag volume times the number of bags to be packed into the case times a pack efficiency factor. This pack efficiency factor has been empirically determined to equal 0.74 for bag former sizes of less than 6 inches and 0.69 for bag former sizes of 6 inches or greater. This relationship is expressed as follows:

Former Size Less Than 6 Inches

Case Volume=0.74(bag volume)(number of bags)

Former Size 6 Inches or Greater

Case Volume=0.69(bag volume)(number of bags)

The available case volume is easily determined for a standard size case by multiplying the case height 405 by the case length 407 and case width 409. A single bag volume is easily determined using the geometric models previously described. Therefore, given a standard case pack size and a calculated single bag volume, the number of bags that can be accommodated in the case pack is easily determined.

A slightly different method must be used for the single layer stand-up configuration when the case height 405 is greater than the effective bag length, such as illustrated by the cases shown in FIGS. 4b and 4c. FIG. 4b shows a case pack with a height slightly greater than the effective bag length, while FIG. 4c shows a case pack with even greater difference between the case height 405 and the effective bag length. In this instance, case pack configurations are determined by comparing the case area or footprint with the cross-sectional area of the bags, again adjusted with an empirically determined pack efficiency factor. The case footprint is easily determined by multiplying the case length 407 by the case width 409. The cross-sectional area of the bag is easily determined using the geometric model previously described with respect to FIG. 2b. A case pack efficiency factor for this calculation has been empirically determined to equal 0.82. Consequently, case pack configuration can be calculated in the single-layer standup configuration when case height 405 is greater than the effective bag length by the following formula:

Case Area=0.82(cross-sectional area of bag)(number of bags)

Once an appropriate case area has been determined, a standard case size is selected that limits the excess case height 405 so that the shorter case shown in FIG. 4b is used over the taller case shown in FIG. 4c.

Similar calculations are made when a single layer side pack configuration is selected. A first example involves a case pack wherein the case height 505 is greater than the effective bag width, such as illustrated in FIGS. 5a and 5b. (The effective bag width is the vertical height of a bag when placed on its side and, with reference to FIG. 2b, can be calculated as follows: Effective bag width=b+PDQ.) FIG. 5a shows a single layer side pack case where the case height 505 is slightly greater than the effective bag width, while FIG. 5c shows a case pack with a case height 505 even greater than the effective bag width. In such instances, case pack configurations are determined by comparing the cross-sectional area of the bag with the case area or footprint adjusted by a pack efficiency factor, which again has been empirically determined to be 0.82. Consequently, this relationship is expressed as follows:

Case Area=0.82(cross-sectional area of bag)(number of bags)

The case area is obtained by simply multiplying the case length 507 by the case width 509. The cross-sectional area of the bag is determined using the geometric modeling described relative to FIG. 2c. By determining the case area and the cross-sectional area of a bag, the number of bags that can be placed into any given standard size case can easily be determined. By knowing the effective bag width, a case pack can also be selected that minimizes the excess case height 505 so that a shorter case such as illustrated in FIG. 5a will be selected over a taller case such as illustrated in FIG. 5b.

The next situation involves a single-layer side pack configuration in which the case height 505 is less than the effective bag width, as illustrated in FIG. 5c. The case pack configuration in this instance is determined by comparing the case volume with the bag volume and adjusting with a pack efficiency factor. The pack efficiency factor has been empirically determined to equal 0.74 for former sizes of less than 6 inches and 0.69 for former sizes of 6 inches or greater. Consequently, the case pack configuration relationship for a single-layer side pack when the case height is less than the effective bag width is expressed as follows:

Former Less than 6 Inches

Case Volume=0.74(bag volume)(number of bags)

Former 6 Inches or Greater

Case Volume=0.69(bag volume)(number of bags)

FIG. 6 illustrates only one example of a multi-layer stand-up/lay-down case pack configuration. While FIG. 6 shows two separate layers of bags in a stand-up configuration, the multi-layer configuration could also comprise bags in lay-down layers or a combination of stand-up and lay-down layers. For the multi-layer configuration, the number of bags that can be accommodated in such case is determined by comparing the bag volume to the case volume and making an adjustment for packing efficiency of this configuration. Once again, it has been empirically determined that the packing efficiency factor for bags of a former size of less than 6 inches is 0.74, while the packing efficiency factor for bags having a former size of greater than or equal to 6 inches is 0.69. Consequently, this relationship is expressed as follows:

Former Size Less than 6 Inches

Case Volume=0.74(bag volume)(number of bags)

Former 6 Inches or Greater

Case Volume=0.69(bag volume)(number of bags)

The above relationships hold true regardless of whether the multi-layer configuration is comprised of stand-up layers, lay-down layers, or a combination of the two. As in previous examples, the case volume can easily be calculated by multiplying the case height 605 by the case length 607 and case width 609. Individual bag volume can also be determined as previously described.

With all of the case pack configuration relationships detailed above in mind, the invention provides a useful tool for both selecting an appropriate case for a desired configuration and confirming that the bag length selected provides for appropriate transportation efficiencies. For example, shipping considerations might determine that a certain standard case size or case pack configuration is desirable for use in distributing the bag size in question. By application of the methods described above, the number of bags which can be contained in any standard configuration can be determined in order to optimize transportation efficiencies. The invention can also be utilized to develop different appropriate bag sizes to conform to certain case pack configurations, if necessary. If any one of these alternative, appropriate bag sizes resulted in an increase in the number of bags that can be packaged in the case under consideration, the alternative bag size can be selected in order to optimize transportation efficiency.

Many of the larger size bags are placed in cases by an automatic case packing machine. Methods of optimizing the efficiency of an automatic case packing machine refer to an auto case pack ("ACP") as the end product. A further alternative step to the invention relates to confirming an appropriate case pack configuration with regard to ACP guidelines, again only relating to larger bags. If necessary, a new bag length can be calculated to conform a sized bag to adjust for ACP guidelines.

There are three primary ACP guidelines which must be considered. First, the bags in the case pack configuration can only face major case panels. Major case panels are the longest case panels, as opposed to the narrower panels. Referring to FIG. 4a, it can be seen that the bags are illustrated as being oriented towards a narrow end panel 411. This orientation would violate ACP guidelines for big bag sizes, as the bags 403 would need to face one of the longer side panels 413. The second ACP guideline is that, in the standup configuration, the bags must be placed only in a single layer, and not, for example, in the multiple-layer standup configuration of FIG. 6. The third ACP guideline involves the inability of the ACP equipment to load heavily-shingled bags, where heavily-shingled means bags that overlap each other in the case. Bag counts of 7, 1 1, 13, or 17 are examples of heavily-shingled case pack configurations. Consequently, if a bag length has been determined that results in a bag count in a preferred case pack configuration of 7, 11, 13, or 17, this bag length must be recalculated in order to result in a case pack configuration having a bag count of 6, 10, 12, or 16, respectively.

If a bag length has been determined that meets all of the ACP guidelines for a preferred case pack configuration, then the steps of the invention have been successfully completed. However, if the ACP guidelines cannot be accommodated, either a different case pack configuration must be attempted or the bag length calculations must be made again selecting a different former size until the determined bag length meets all of the ACP guidelines.

A further alternative step of the invention involves determining if the overall case weight greater than a pre-determined weight limit after the case pack configuration has been determined. For example, it may be desirable to have a case weight of 8 lbs. or less. After the case pack configuration has been determined, the gross weight of the overall case pack can easily be calculated to determine if the case weight is within this limit. If not, the case pack can be reduced in order to meet this criteria.

The following examples are provided in order to demonstrate the invention as previously employed by Applicants.

EXAMPLE 1

Use the Nacho Cheese Doritos Model to Weight-up 9 oz. Bag to 10.5 oz.

INPUTS:
Input the new weight (input 10.5)
Input a former size for the new bag (input 8.5)
Input a case pack configuration (input "SP" for side packed)
Input a case size (input 7)
OUTPUTS:
Model determines the bag length (14.75)
Model determines the aim and maximum air fill (aim=8.0, max=8.5)
Model determines the end seal size (0.5)
Model determines the number of bags per case that can be packed side pack (7)
Model determines if the ACP case pack is different than the manual case pack (No Change)
Model determines if the case weight is greater than 8 lbs. If so, will reduce the case pack accordingly (No Change)

EXAMPLE 2

Use the Small Bag Lay's Model to Weight out the 1.75 oz. Bag to 1.25 oz.

INPUTS:
Input the new weight (input 1.25)
Input a former size for the new bag (input 5.25)
Input a case pack configuration (input "SU" for stand-up)
Input a case size (input 7)
OUTPUTS:
Model determines the bag length (8.45)
Model determines the aim and maximum air fill using built in look up table for small bags (aim=3.75, max=4)
Model determines the end seal size (0.25)
Model determines the number of bags per case that can be packed stand-up (42)
Model determines if the ACP case pack is different than the manual case pack (No Change)
Model determines if the case weight is greater than 8 lbs. If so, will reduce the case pack accordingly (No Change).

The invention disclosed in one preferred embodiment performs all calculations on a computer using computer software integrated with the required empirical data. A second preferred embodiment of the invention comprises the various calculations being performed on a spreadsheet with all empirical data being manually inputted by a computer operator. A third preferred embodiment involves various calculations being performed manually, by way of an electronic calculator or other such device, with reference to empirical tables and charts. It should be understood that the steps comprising the invention can be practiced in any number of ways using any number of means, such as computers and various software combinations, to accomplish a solution bag length and case pack configuration.

The invention's ability to quickly determine both a bag size and a case pack configuration provides a powerful tool for quickly comparing various bag sizing factors. For example, bag film costs could be quickly determined for various bag sizes by the invention in order to optimize production expenses. Follow-ups of consumer preference studies could be quickly initiated by generating several bag sizing models for comparison. Cost and benefit analysis of changing bag size could be accomplished prior to investing time and resources in bag sizing trails.

While the invention has been particularly shown and described with reference to preferred embodiments, it will be understood by those skilled in the art that various changes in form and detail may be made therein without departing from the spirit and scope of the invention.

What is claimed is:

1. A method for determining a bag size for a given weight of product comprising the steps of:
    (a) selecting a former size;
    (b) determining an end seal width based on said former size;

(c) determining a Product Displacement Quantifier based on said former size;
(d) determining empirically the relationship between bag volume and product weight for a given product;
(e) solving for a bag length using the selected former size, the determined end seal width, determined Product Displacement Quantifier, and determined relationship between bag volume and product weight; and
(f) confirming the selected former size selected based on empirical data.

2. The method of claim 1 wherein steps (a) through (f) are repeated until a selected former size is confirmed based on empirical data.

3. The method of claim 1 wherein at step (b) an end seal of ¼ inch is determined for a former size of less than 6 inches and an end seal of ½ inch is determined for a former size of 6 inches or greater.

4. The method of claim 1 wherein the bag length is solved at step (e) by using the following formula:

$$\text{Bag Length} = \frac{y\text{-intercept} + \text{slope}(wt) - (\text{former} - \pi PDQ/2)(\pi PDQ^2/4)}{PDQ(\text{former} - \pi PDQ/2 + \pi PDQ/4)} + 2ES + \pi PDQ/2$$

where the y-intercept and slope are taken from an empirical plot of bag volume versus product weight for the product.

5. The method of claim 1 wherein the Product Displacement Quantifier is determined in step (c) by subtracting 0.5 from the selected former size and using the resultant number expressed in centimeters.

6. The method of claim 5 wherein the selected former size is confirmed in step (f) by determining a bag width to former size ratio and comparing said ratio to empirically determined relationships between Product Displacement Quantifiers and former sizes.

7. The method of claim 5 wherein the former size is confirmed in step (f) when a bag width to former size ratio of the sized bag is between 1.6 and 2.0.

8. The method of claim 1 wherein the Product Displacement Quantifier is determined in step (c) and the selected former size is confirmed in step (f) by use of empirically determined relationships between former size, bag length, desired Product Displacement Quantifier, maximum acceptable Product Displacement Quantifier, and bag volume.

9. A method for determining bag size and case pack configurations for a given weight of product, said method comprising the steps of:
    (a) selecting a former size;
    (b) determining an end seal width based on said former size;
    (c) determining a Product Displacement Quantifier based on said former;
    (d) determining the relationship between bag volume and product weight from historical sizing trial data;
    (e) determining a bag length based on the selected former, determined end seal width, determined Product Displacement Quantifier, and determined relationship between bag volume and product weight;
    (f) confirming the selected former size based on empirical data; and
    (g) determining a case pack configuration for the determined bag size.

10. The method of claim 9 wherein steps (a) through (f) are repeated until a selected former size is confirmed based on empirical data.

11. The method of claim 9 wherein at step (b) an end seal of ¼ inch is determined for a former size of less than 6 inches and an end seal of ½ inch is determined for a former size of 6 inches or greater.

12. The method of claim 9 wherein the bag length is solved at step (e) by using the following formula:

$$\text{Bag Length} = \frac{y\text{-intercept} + \text{slope}(wt) - (\text{former} - \pi PDQ/2)(\pi PDQ^2/4)}{PDQ(\text{former} - \pi PDQ/2 + \pi PDQ/4)} + 2ES + \pi PDQ/2$$

where the y-intercept and slope are taken from an empirical plot of bag volume versus product weight for the product.

13. The method of claim 9 wherein the Product Displacement Quantifier is determined in step (c) by subtracting 0.5 from the selected former size and using the resultant number expressed in centimeters.

14. The method of claim 13 wherein the selected former size is confirmed in step (f) by determining a bag width to former size ratio and comparing said ratio to empirically determined relationships between Product Displacement Quantifiers and former sizes.

15. The method of claim 13 wherein the former size is confirmed in step (f) when a bag width to former size ratio of the sized bag is between 1.6 and 2.0.

16. The method of claim 9 wherein the Product Displacement Quantifier is determined in step (c) and the selected former size is confirmed in step (f) by use of empirically determined relationships between former size, bag length, desired Product Displacement Quantifier, maximum acceptable Product Displacement Quantifier, and bag volume.

17. The method of claim 9 wherein step (g) further comprises selecting an empirically determined relationship between the size of a case and the number of bags that can be contained therein and applying said selected relationship to determine the number of bags that can be contained by a given case.

18. The method of claim 17 wherein the selection of an empirically determined relationship between the size of a case and the number of bags that can be contained therein is based on the bag former size, the case pack arrangement of said case, and the relationship between the case height and the bag size.

19. The method of claim 17 wherein the selected relationship is expressed by the following formula:

Case Volume=0.74(bag volume)(number of bags)

20. The method of claim 17 wherein the selected relationship is expressed by the following formula:

Case Volume=0.69(bag volume)(number of bags)

21. The method of claim 17 wherein the selected relationship is expressed by the following formula:

Case Area=0.82(cross-sectional area of bag)(number of bags)

22. A computer readable medium containing program instructions for:
    (a) selecting a former size;
    (b) determining an end seal based on said former size;
    (c) determining a Product Displacement Quantifier based on said former size;
    (d) determining empirically the relationship between bag volume and product weight for a given product;

(e) solving for a bag length using the selected former size, the determined end seal width, determined Product Displacement Quantifier, and determined relationship between bag volume and product weight; and (f) confirming the selected former size selected based on empirical data, thereby determining a bag size for a given weight of contained product.

23. The computer readable medium of claim 22 wherein steps (a) through (f) are repeated until a selected former size is confirmed based on empirical data.

24. The computer readable medium of claim 22 wherein at step (b) an end seal of ¼ inch is determined for a former size of less than 6 inches and an end seal of ½ inch is determined for a former size of 6 inches or greater.

25. The computer readable medium of claim 22 wherein the bag length is solved at step (e) by using the following formula:

$$\text{Bag Length} = \frac{y\text{-intercept} + \text{slope}(wt) - (\text{former} - \pi PDQ/2)(\pi PDQ^2/4)}{PDQ(\text{former} - \pi PDQ/2 + \pi PDQ/4)} + \frac{}{2ES + \pi PDQ/2}$$

where the y-intercept and slope are taken from an empirical plot of bag volume versus product weight for the given product.

26. The computer readable medium of claim 22 wherein the Product Displacement Quantifier is determined in step (c) by subtracting 0.5 from the selected former size and using the resultant number expressed in centimeters.

27. The computer readable medium of claim 26 wherein the selected former size is confirmed in step (f) by determining a bag width to former size ratio and comparing said ratio to empirically determined relationships between Product Displacement Quantifiers and former sizes.

28. The computer readable medium of claim 26 wherein the former size is confirmed in step (f) when a bag width to former size ratio of the sized bag is between 1.6 and 2.0.

29. The computer readable medium of claim 22 wherein the Product Displacement Quantifier is determined in step (c) and the selected former size is confirmed in step (f) by use of empirically determined relationships between former size, bag length, desired Product Displacement Quantifier, maximum acceptable Product Displacement Quantifier, and bag volume.

30. The computer readable medium of claim 22 further comprising programming instructions for:

(g) determining a case pack configuration for the determined bag size.

31. The computer readable medium of claim 30 wherein step (g) further comprises selecting an empirically determined relationship between the size of a case and the number of bags that can be contained therein and applying said selected relationship to determine the number of bags that can be contained by a given case.

32. The computer readable medium of claim 31 wherein the selection of an empirically determined relationship between the size of a case and the number of bags that can be contained therein is based on the bag former size, the case pack arrangement of said case, and the relationship between the case height and the bag size.

33. The computer readable medium of claim 31 wherein the selected relationship is expressed by the following formula:

Case Volume=0.74(bag volume)(number of bags)

34. The computer readable medium of claim 31 wherein the selected relationship is expressed by the following formula:

Case Volume=0.69(bag volume)(number of bags)

35. The computer readable medium of claim 31 wherein the selected relationship is expressed by the following formula:

Case Area=0.82(cross-sectional area of bag)(number of bags)

36. A method using a computer to determine a bag size and case pack configuration for a given product weight comprising the steps of:

(a) selecting a former size;

(b) determining an end seal width based on said former size;

(c) determining a Product Displacement Quantifier based on said former;

(d) determining the relationship between bag volume and product weight from historical sizing trial data;

(e) determining a bag length based on the selected former, determined end seal width, determined Product Displacement Quantifier, and determined relationship between bag volume and product weight;

(f) confirming the selected former size based on empirical data; and (g) determining a case pack configuration for the determined bag size.

37. The method of claim 36 wherein steps (a) through (f) are repeated until a selected former size is confirmed based on empirical data.

38. The method of claim 36 wherein at step (b) an end seal of ¼ inch is determined for a former size of less than 6 inches and an end seal of ½ inch is determined for a former size of 6 inches or greater.

39. The method of claim 36 wherein the bag length is solved at step (e) by using the following formula:

$$\text{Bag Length} = \frac{y\text{-intercept} + \text{slope}(wt) - (\text{former} - \pi PDQ/2)(\pi PDQ^2/4)}{PDQ(\text{former} - \pi PDQ/2 + \pi PDQ/4)} + \frac{}{2ES + \pi PDQ/2}$$

where the y-intercept and slope are taken from an empirical plot of bag volume versus product weight for the product.

40. The method of claim 36 wherein the Product Displacement Quantifier is determined in step (c) by subtracting 0.5 from the selected former size and using the resultant number expressed in centimeters.

41. The method of claim 40 wherein the selected former size is confirmed in step (f) by determining a bag width to former size ratio and comparing said ratio to empirically determined relationships between Product Displacement Quantifiers and former sizes.

42. The method of claim 40 wherein the former size is confirmed in step (f) when a bag width to former size ratio of the sized bag is between 1.6 and 2.0.

43. The method of claim 36 wherein the Product Displacement Quantifier is determined in step (c) and the selected former size is confirmed in step (f) by use of empirically determined relationships between former size, bag length, desired Product Displacement Quantifier, maximum acceptable Product Displacement Quantifier, and bag volume.

44. The method of claim 36 wherein step (g) further comprises selecting an empirically determined relationship between the size of a case and the number of bags that can be contained therein and applying said selected relationship to determine the number of bags that can be contained by a given case.

45. The method of claim 44 wherein the selection of an empirically determined relationship between the size of a case and the number of bags that can be contained therein is based on the bag former size, the case pack arrangement of said case, and the relationship between the case height and the bag size.

46. The method of claim 44 wherein the selected relationship is expressed by the following formula:

$$\text{Case Volume} = 0.74(\text{bag volume})(\text{number of bags})$$

47. The method of claim 44 wherein the selected relationship is expressed by the following formula:

$$\text{Case Volume} = 0.69(\text{bag volume})(\text{number of bags})$$

48. The method of claim 44 wherein the selected relationship is expressed by the following formula:

$$\text{Case Area} = 0.82(\text{cross-sectional area of bag})(\text{number of bags})$$

* * * * *